(12) United States Patent
Marques

(10) Patent No.: US 7,341,966 B2
(45) Date of Patent: Mar. 11, 2008

(54) BOROSILICATE GLASS COMPOSITIONS AND USES THEREOF

(75) Inventor: Paulo Marques, Fontainebleau (FR)

(73) Assignee: Corning Incorporated, Corning, NY (US)

( * ) Notice: Subject to any disclaimer, the term of this patent is extended or adjusted under 35 U.S.C. 154(b) by 239 days.

(21) Appl. No.: 10/728,523

(22) Filed: Dec. 2, 2003

(65) Prior Publication Data

US 2004/0152580 A1 Aug. 5, 2004

(30) Foreign Application Priority Data

Dec. 3, 2002 (EP) ................................. 02292981

(51) Int. Cl.
*C03C 3/091* (2006.01)
*C03C 3/095* (2006.01)

(52) U.S. Cl. .................... 501/66; 501/64; 501/65; 501/67

(58) Field of Classification Search ............ 501/64–67
See application file for complete search history.

(56) References Cited

U.S. PATENT DOCUMENTS

| | | | | |
|---|---|---|---|---|
| 4,520,115 A | * | 5/1985 | Speit et al. | 501/60 |
| 4,562,161 A | * | 12/1985 | Mennemann et al. | 501/59 |
| 4,665,039 A | * | 5/1987 | Kokubu et al. | 501/39 |
| 5,200,369 A | * | 4/1993 | Clifford et al. | 501/66 |
| 5,262,363 A | * | 11/1993 | Yoshida et al. | 501/17 |
| 5,304,516 A | * | 4/1994 | Clifford | 501/21 |
| 5,447,891 A | * | 9/1995 | Spinosa et al. | 501/16 |
| 5,605,869 A | * | 2/1997 | Mangat et al. | 501/14 |
| 5,736,476 A | * | 4/1998 | Watzke et al. | 501/67 |
| 5,747,395 A | * | 5/1998 | Smith et al. | 501/5 |
| 5,747,399 A | * | 5/1998 | Kosokabe et al. | 501/67 |
| 6,204,212 B1 | * | 3/2001 | Kunert et al. | 501/67 |
| 6,205,819 B1 | | 3/2001 | Ackler et al. | |
| 6,794,323 B2 | * | 9/2004 | Peuchert et al. | 501/66 |
| 2002/0174686 A1 | | 11/2002 | Krulevitch et al. | |
| 2003/0134734 A1 | * | 7/2003 | Nishimoto et al. | 501/69 |
| 2005/0215414 A1 | * | 9/2005 | Kawai | 501/69 |

FOREIGN PATENT DOCUMENTS

| | | | |
|---|---|---|---|
| DE | 10035801 A1 | * | 2/2002 |
| EP | 0151346 | | 8/1985 |
| EP | 0509792 | | 10/1992 |
| EP | 509792 A2 | * | 10/1992 |
| JP | 63218525 A | * | 9/1988 |
| JP | 2004315279 A | * | 11/2004 |
| JP | 2004315280 A | * | 11/2004 |
| WO | WO94/21372 | | 9/1994 |

OTHER PUBLICATIONS

Derwent Abstract 1988-297261, Abstract of JP 63-218525A.*
Derwent Abstract 2002-179892, Abstract of DE 10035801 A1.*
Derwent Abstract 2004-807182, Abstract of JP2004-315279 A.*
Derwent Abstract 2004-807183, Abstract of JP2004-315280 A.*

* cited by examiner

*Primary Examiner*—J. A. Lorengo
*Assistant Examiner*—Elizabeth A. Bolden
(74) *Attorney, Agent, or Firm*—Gregory V. Bean

(57) ABSTRACT

Glass, glass compositions, methods of preparing the glass compositions, microfluidic devices that include the glass composition, and methods of fabricating microfluidic devices that include the glass composition are disclosed. The borosilicate glass composition includes silicon dioxide ($SiO_2$) in a range from about 60% to 74% by total composition weight; boric oxide ($B_2O_3$) in a range from about 9% to 25% by total composition weight; aluminum oxide ($Al_2O_3$) in a range from about 7% to 17% by total composition weight; and at least one alkali oxide in a range from about 2% to 7% by total composition weight. In addition, the borosilicate glass has a coefficient of thermal expansion (CTE) that is in a range between about $30 \times 10^{-7}/°$ C. and $55 \times 10^{-7}/°$ C. Furthermore, the borosilicate glass composition resists devitrification upon sintering without the addition of an inhibitor oxide.

5 Claims, 1 Drawing Sheet

BOROSILICATE GLASS COMPOSITIONS AND USES THEREOF

CROSS-REFERENCE TO RELATED APPLICATION

This application claims the benefit of priority under 35 U.S.C. § 119 of European Patent Application Serial No. 02 292 981.4 filed on Dec. 3, 2002.

This application is related to U.S. utility patent application entitled "A Microfluidic Device and Manufacture Thereof" filed on 12 May 2004 and accorded Ser. No. 10/843,949, now issued as U.S. Pat. No. 7,007,709, which is a continuation of Ser. No. 10/454,985, filed 4 Jun. 2003 and now issued as U.S. Pat. No. 6,769,444, which is a continuation of Ser. No. 10/163,215, filed 4 Jun. 2002 and now issued as U.S. Pat. No. 6,595,232, which is entirely incorporated herein by reference.

TECHNICAL FIELD

The present invention is generally related to glass compositions and, more particularly, is related to borosilicate glass compositions and uses thereof.

BACKGROUND OF THE INVENTION

Borosilicate glass is a well-known glass that has a low coefficient of thermal expansion (CTE) $33\times10^{-7}/°$ C. and high chemical durability (i.e., resistance to acidic and alkaline reagents). As a result, borosilicate glass has become an important component in many types of laboratory equipment that require chemical durability.

However, powdered borosilicate glass (borosilicate glass frit) undergoes devitrification (i.e., formation of cristobalite, tridymite, and/or quartz crystals that lead to a decrease in glass properties) during sintering at between about 700-800° C. Crystal formation with high CTE lowers the mechanical strength of the sintered glass product. Lower mechanical strength is also due to the volume change associated with the phase transformation from an amorphous state to the crystal state. Thus, when powdered borosilicate glass is used to make frit layers on a substrate having a low CTE, devitrification increases global CTE of the frit layer and thereby causes cracks to form.

One potential solution to overcome devitrification in powdered borosilicate glass is to add an inhibitor oxide such as alumina to the powdered borosilicate glass. The addition of the alumina tends to inhibit the formation of high expansion crystals. The addition of alumina, however, causes the sintering ability of the frit glass to decrease. In addition, the fluidity of the frit glass is decreased during sintering when alumina has been added.

Thus, a heretofore unaddressed need exists in the industry to form a glass frit that addresses the aforementioned deficiencies and/or inadequacies.

SUMMARY OF THE INVENTION

A representative borosilicate glass includes a borosilicate glass composition. The borosilicate glass composition includes silicon dioxide ($SiO_2$) in a range from about 60% to 74% by total composition weight; boric oxide ($B_2O_3$) in a range from about 9% to 25% by total composition weight; aluminum oxide ($Al_2O_3$) in a range from about 7% to 17% by total composition weight; and at least one alkali oxide in a range from about 2% to 7% by total composition weight. In addition, the borosilicate glass has a coefficient of thermal expansion (CTE) that is in a range between about $30\times10^{-7}/°$ C. and $55\times10^{-7}/°$ C. Furthermore, the borosilicate glass composition resists devitrification upon sintering without the addition of an inhibitor oxide.

A representative method of making a borosilicate glass includes forming a homogeneous mixture by mixing a plurality of components. The components of the homogeneous mixture include silicon dioxide ($SiO_2$) in a range from about 60% to 74% by total composition weight, boric oxide ($B_2O_3$) in a range from about 9% to 25% by total composition weight, aluminum oxide ($Al_2O_3$) in a range from about 7% to 17% by total composition weight, and at least one alkali oxide in a range from about 2% to 7% by total composition weight. Next the method includes melting the homogeneous mixture; and sintering the homogeneous mixture forming a borosilicate glass. The borosilicate glass has a coefficient of thermal expansion (CTE) that is in a range between about $30\times10^{-7}/°$ C. and $55\times10^{-7}/°$ C. In addition, the homogeneous mixture resists devitrification upon sintering without the addition of an inhibitor oxide.

A representative microfluidic device includes a first assembly and a second assembly. The first assembly includes a microstructure that is disposed on a first substrate. The second assembly includes a second substrate and a precursor material. The second assembly and the first assembly are positioned such that the precursor material and the microstructure are adjacent one another. The second assembly is positioned on the microstructure after the first assembly is presintered and adhered thereto by heat treatment to form a one-piece microstructure defining at least one recess between the first and second assemblies. The precursor material includes silicon dioxide ($SiO_2$) in a range from about 60% to 74% by total composition weight; boric oxide ($B_2O_3$) in a range from about 9% to 25% by total composition weight; aluminum oxide ($Al_2O_3$) in a range from about 7% to 17% by total composition weight; and at least one alkali oxide in a range from about 2% to 7% by total composition weight. In addition, the precursor material has a coefficient of thermal expansion (CTE) that is in a range between about $30\times10^{-7}/°$ C. and $55\times10^{-7}/°$ C. Further, the precursor material resists devitrification upon sintering without the addition of an inhibitor oxide.

A representative method of fabricating a microfluidic device includes providing a first assembly and a second assembly. The first assembly includes a microstructure that is disposed on a first substrate. The second assembly includes a second substrate and a precursor material. The precursor material includes a borosilicate glass composition that has a coefficient of thermal expansion (CTE) that is in a range between about $30\times10^{-7}/°$ C. and $55\times10^{-7}/°$ C. In addition, the borosilicate glass composition resists devitrification upon sintering without the addition of an inhibitor oxide. The precursor material includes silicon dioxide ($SiO_2$) in a range from about 60% to 74% by total composition weight; boric oxide ($B_2O_3$) in a range from about 9% to 25% by total composition weight; aluminum oxide ($Al_2O_3$) in a range from about 7% to 17% by total composition weight; and at least one alkali oxide in a range from about 2% to 7% by total composition weight. In addition, the precursor material has a coefficient of thermal expansion (CTE) that is in a range between about $30\times10^{-7}/°$ C. and $55\times10^{-7}/°$ C. Further, the precursor material resists devitrification upon sintering without the addition of an inhibitor oxide. The method also includes disposing the first assembly on the second assembly such that the precursor material and the microstructure are adjacent one another and heating the first assembly and the second assembly to form a one-piece microstructure defining at least one recess between the first and second assemblies.

Other compositions, systems, methods, devices, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE PREFERRED EMBODIMENT

Figure 1:
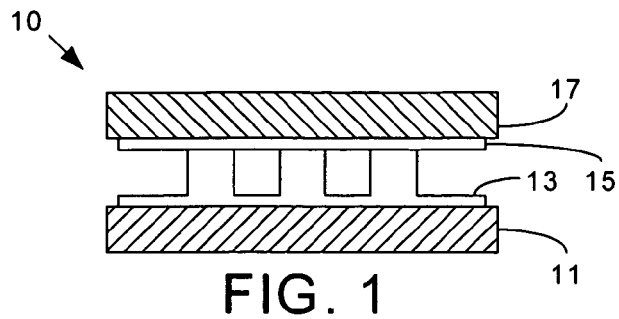
FIG. 1 is a cross-sectional view that illustrates an exemplary microfluidic device that includes the borosilicate glass composition of the present invention.

Embodiments of the present invention provide for borosilicate glass compositions, methods of preparation thereof, and structures incorporating borosilicate glass formed from the borosilicate glass compositions. Embodiments of the present invention overcome at least some of the aforementioned deficiencies and inadequacies described above by providing borosilicate glass compositions that self-inhibit the formation of detrimental crystals. As discussed above, formation of one or more of these crystals may likely cause an increase in the coefficient of thermal expansion (CTE). Consequently, the glass product loses mechanical strength due, at least in part, to the volume change associated with crystal formation.

In addition, the borosilicate glass compositions may be formulated to resist thermal shock, be chemically resistant to acidic and alkaline chemical reagents, and have low softening points, while not devitrifying and causing crystals.

In particular, a glass formed from an embodiment of the borosilicate glass composition preferably has a coefficient of thermal expansion (CTE) that is in a range between about $30 \times 10^{-7}/°$ C. and $55 \times 10^{-7}/°$ C. In addition, the borosilicate glass composition preferably resists devitrification upon sintering without the addition of an inhibitor oxide (i.e., alumina powder), as discussed above, which decreases sintering ability and fluidity of the borosilicate glass composition during sintering.

Embodiments of the borosilicate glass composition include, among others, silicon dioxide ($SiO_2$), boric oxide ($B_2O_3$), aluminum oxide ($Al_2O_3$), and at least one alkali oxide. The alkali oxide may preferably include lithium oxide ($Li_2O$), potassium oxide ($K_2O$), and sodium oxide ($Na_2O$). Not intending to be bound by theory, it appears that $Al_2O_3$ plays a role in inhibiting the formation of cristobalite and tridymite crystals during the sintering of the borosilicate glass composition. In addition, it appears that $B_2O_3$ increases the meltability of the borosilicate glass composition and acts as an efficient flux without significantly increasing the CTE of the borosilicate glass, while the alkali oxide increases the CTE of the borosilicate glass.

It is also possible to add conventional finishing agents such as $As_2O_3$ or $Sb_2O_3$, fluorides, bromides, or chlorides, with the provision that their total content does not exceed approximately 1%. If desired, bleaching agents may be added. It is also possible to color the glass by adding conventional coloring elements.

In particular, one embodiment of the borosilicate glass composition includes $SiO_2$ in a range between about 60% and 74% by total composition weight, $B_2O_3$ in a range between about 9% and 25% by total composition weight, $Al_2O_3$ in a range between about 7% and 17% by total composition weight, and the at least one alkali oxide in a range between about 2% and 7% by total composition weight.

In addition, the borosilicate glass composition may include one or more alkaline-earth oxides. The alkaline-earth oxides include barium oxide (BaO), strontium oxide (SrO), calcium oxide (CaO), and magnesium (MgO). Furthermore, the borosilicate glass composition may include one or more rare-earth oxides such as, but not limited to, lanthanum oxide ($La_2O_3$), tantalum oxide ($Ta_2O_3$), yttrium oxide ($Y_2O_3$), and cerium oxide ($CeO_2$). The sum of the weight percentages of the alkaline-earth oxides and/or the rare-earth oxides is in a range between about 0.1% and 7% by total composition weight. Again, not intending to be bound by theory, it appears the alkaline-earth oxide increases the CTE of a borosilicate glass formed from the borosilicate glass composition.

Furthermore, the borosilicate glass composition may also include zirconium oxide ($ZrO_2$) in the range between about 0.1% and 5% by total composition weight. Not intending to be bound by theory, addition of the $ZrO_2$ to the borosilicate glass composition appears to enhance resistance to alkaline reagents.

In another embodiment the borosilicate glass composition preferably includes $SiO_2$, $B_2O_3$, $Al_2O_3$, $Li_2O$, and $ZrO_2$. Not intending to be bound by theory, it appears that $Na_2O$ and/or $K_2O$ can increase the likelihood of and extent of devitrification and are therefore not included in this embodiment. In addition, $B_2O_3$ is included to increase melt ability, stability, and reduce glass viscosity, and $Li_2O$ increases melt ability, lowers glass viscosity, and also increases CTE. In particular, adding $Al_2O_3$ to the borosilicate glass composition causes substitution of $Si^{4+}$ with $Al^{3+}$ in the atomic glass network. Consequently, $Li^+$ is strongly bonded to the glass network because of the strong coupling between $Li^+$ and $Al^{3+}$, which occurs from a need to maintain electroneutrality at the local atomic level. The strong bond of $Li^+$ to the glass network enhances the acidic resistance of the borosilicate glass composition. Addition of the $ZrO_2$ to the borosilicate glass composition appears to enhance alkali resistance.

This embodiment of the borosilicate glass composition can be used to from a glass that has a CTE in a range between about $30 \times 10^{-7}/°$ C. and $45 \times 10^{-7}/°$ C. upon sintering. The borosilicate glass formed from the borosilicate glass composition has a softening point in a range between about 600 and 1000° C. In addition, the borosilicate glass has a percent weight loss of less than about 10 milligrams/$dm^2$ according to the DIN 12116 acid resistance test (i.e., determining the percent weight loss after placing the borosilicate glass in a boiling aqueous solution of hydrochloric acid 6N for 6 hours). Furthermore, the borosilicate glass has a percent weight loss of less than about 250 milligrams/$dm^2$ according to the ISO 695 alkali resistance test (i.e., determining the percent weight loss after placing the borosilicate glass in a boiling aqueous solution of mixed alkali for 3 hours).

In particular, the borosilicate glass composition includes $SiO_2$ in the range between about 68% and 73% by total composition weight, $B_2O_3$ in the range between about 13% and 17% by total composition weight, $Al_2O_3$ in the range between about 8% and 15% by total composition weight, $Li_2O$ in the range between about 2% and 5% by total composition weight, and $ZrO_2$ in the range between about 1% and 3% by total composition weight. In addition, the sum of the weight percent of $SiO_2$, $Al_2O_3$, and $ZrO_2$ in the borosilicate glass composition is less than 78% by total composition weight.

The method of forming borosilicate glass composition includes forming a homogeneous mixture of the components of the borosilicate glass composition described above. The homogeneous mixture is then melted at a temperature of about 1650±10° C. in a platinum-rhodium crucible or the like, which may take from about 5 to 10 hours. After the homogeneous mixture is melted, the melted composition is quenched into deionized water and then milled in dry conditions using an alumina ball mill or the like into borosilicate frit particles. Then sieved particles are disposed into a mold (i.e., silicon mold) and sintered at a temperature about 20° C. above the softening point of the borosilicate glass (i.e., about 850° C.) for about 20 to 40 minutes.

Table 1 includes three (Compositions 1-3) representative inventive borosilicate glass compositions, a previous borosilicate glass chemical composition, and two other glass compositions (Compositions A and B). In addition, glass properties (e.g., bulk glass CTE, softening point, DIN 12116 acid resistance test, and ISO 695 alkali resistance test) and glass powder properties (e.g., sintered glass CTE and crystalline phase) were measured for each composition listed above and are included in Table 1 for comparative purposes. As can be seen from Table 1, Compositions 1-3 have CTE's (sintered glass) and softening points less than the previous borosilicate glass composition. In addition, Compositions 2 and 3 have comparable chemical resistances to that of the previous borosilicate. Compositions 1-3 do not form cristobalite crystalline phases, while the previous borosilicate and Compositions A and B form cristabalite crystalline phases. Thus, Compositions 1-3 have physical characteristics superior to that of the previous borosilicate chemical composition and Compositions A and B.

TABLE 1

|  | Comp. 1 (% weight) | Comp. 2 (% weight) | Comp. 3 (% weight) | previous borosilicate (% weight) | Comp. A (% weight) | Comp. B (% weight) |
| --- | --- | --- | --- | --- | --- | --- |
| $SiO_2$ | 65 | 71 | 71 | 81 | 70 | 74.7 |
| $B_2O_3$ | 15 | 15 | 15 | 13 | 15 | 13 |
| $Al_2O_3$ | 11 | 10.7 | 9.7 | 2 | 3 | 9 |
| $Li_2O$ | 2 | 3.3 | 3.3 | — | 1 | 3.3 |
| $Na_2O$ | — | — | — | 4 | — | — |
| $K_2O$ | 2 | — | — | — | 6 | — |
| BaO | 5 | — | — | — | 5 | — |
| $ZrO_2$ | — | — | 1 | — | — | — |
| Bulk Glass CTE ($10^{-7}$/° C.) | 39.1 | 34.6 | 33.8 | 32.5 | 40.1 | 35.6 |
| Sintered Glass CTE ($10^{-7}$/° C.) | 39.7 | 35 | 35.2 | 79.2 | 121 | 80.6 |
| Softening Point (° C.) | 790 | 808 | 795 | 823 | — | 777 |
| DIN 12116 (mg/dm$^2$) | 42 | 1.7 | 2.8 | <0.1 | — | 0.4 |
| ISO 695 (mg/dm$^2$) | — | 226 | 153 | 102 | — | 113 |
| Crystalline Phases | Amorphous | Amorphous/ Quartz | Amorphous/ Quartz | Cristobalite | Cristobalite | Cristobalite/ Quartz |

In another embodiment of the present invention, the borosilicate glass compositions can be used in microfluidic devices as precursor materials that may enhance the contact between components of the microfluidic device (i.e., a substrate and a microstructure). The borosilicate glass formed from the borosilicate glass composition has a CTE that is compatible with the CTE of the other components of the microfluidic device upon sintering. The compatible CTEs allow fabrication and use without mechanical stresses. In addition, the borosilicate glass composition may be formulated so that the borosilicate glass formed from the borosilicate glass composition is chemically resistant to chemical reagents (i.e., acidic and/or alkaline chemical reagents) that may be used during the operation of the microfluidic device.

Reference will now be made to the figures. FIG. 1 is a cross-sectional view of a representative microfluidic device 10 that incorporates a borosilicate glass composition of the present invention. The microfluidic device 10 includes a first substrate 11, a microstructure 13, a precursor material 15, and a second substrate 17. The microstructure 13 is disposed between the first substrate 11 and the precursor material 15.

The precursor material 15 is disposed on the second substrate 17 adjacent the microstructure 13.

The first substrate 11, the microstructure 13, and second substrate 17 can be made of materials such as, but not limited to glasses, glass ceramics, ceramics, metals, semiconductors, or combinations thereof. The first substrate 11, the microstructure 13, and the second substrate 17 can be constructed of the same or of different materials.

The first substrate 11, the microstructure 13, the precursor material 15, and the second substrate 17 can be combined to form recesses bounded by the microstructure 13 and the precursor material 15. The recesses can have various cross-sectional dimensions such as, but not limited to, substantially square, substantially rectangular, substantially hexagonal, semicircular, or substantially circular. For example, FIG. 1 shows the recesses to be substantially square.

In addition, the total volume of the recesses can vary depending on the particular application. The degree of perforation (i.e., the empty space between the ridges of the microstructure 13) of the microstructure 13 determines the total volume. The preferred embodiment of the microstructure 13 includes a microstructure that is highly perforated so that the total volume of the recesses is large. For example, the percentage of empty space bounded by the microstructure 13 and the precursor material 15 is typically greater than about 50%. However, lower volume percentages are contemplated and are within the scope of the present invention.

In particular, the first substrate 11 and the second substrate 17 have a thickness in the range of about 200 μm to about 3 millimeters (mm), and preferable at least 200 μm. The microstructure 13 can have a width in the range of about 100 μm to about 300 μm and a height of up to approximately 800 μm; the widths of the resulting recesses are in the range of about 50 μm to more than about 1000 μm.

As depicted in FIG. 1, the walls of the microstructure 13 that form the recesses can have a constant thickness. However, the thickness of the wall may be constant, tapered, flaring, or a combination thereof and can be tailored for a particular application.

Embodiments of the microfluidic device 10 can include at least one porous structure (i.e., first substrate 11, second substrate 17, and/or a microstructure 13). The porous structure may be used to perform separations within the microfluidic device 10. In addition, a porous structure can be used to affix a catalyst thereto, as discussed below.

In general, the microfluidic device 10 may include appropriate passages (not shown) for inlet and outlet of one or more fluids that flow within the microfluidic device 10. The inlet/outlet can be formed through the first substrate 11, the second substrate 17, and/or the microstructure 13.

The precursor material 15 can be made of the borosilicate glass compositions described above. The preferred embodiment of the precursor material 15 includes $SiO_2$, $B_2O_3$, $Al_2O_3$, $Li_2O$, and $ZrO_2$. This composition can be used to form a borosilicate glass that has a CTE in a range between about $30 \times 10^{-7}/°$ C. and $45 \times 10^{-7}/°$ C. upon sintering. In addition, the borosilicate glass formed from the borosilicate glass composition preferably has a softening point in a range between about 600 and 1000° C. Further, the borosilicate glass preferably has a percent weight loss of less than 10 milligrams/$dm^2$ according to the DIN 12116 acid resistance test as described above. Furthermore, the borosilicate glass preferably exhibits a percent weight loss of less than 250 milligrams/$dm^2$ according to the ISO 695 alkali resistance test as described above.

In particular, the precursor material 15 includes a borosilicate glass composition having $SiO_2$ in the range between about 68% and 73% by total composition weight, $B_2O_3$ in the range between about 13% and 17% by total composition weight, $Al_2O_3$ in the range between about 8% and 15% by total composition weight, $Li_2O$ in the range between about 2% and 5% by total composition weight, and $ZrO_2$ in the range between about 1% and 3% by total composition weight. In addition, the sum of the weight percent of SiO2, $Al_2O_3$, and $ZrO_2$ in the precursor material 15 is less than about 78% by total composition weight.

In another embodiment, the precursor material 15 includes an organic medium such as, but not limited to, a thermoplastic medium, a thermosetting medium, or a photopolymerizable medium. The organic medium is added to the precursor material 15 to assist in vacuum molding of the precursor material 15. Subsequently, the organic medium present in the precursor material 15 is substantially eliminated during pre-sintering and sintering.

In general, the CTE of the first substrate 11, the microstructure 13, the precursor material 15, and the second substrate 17 are compatible to prevent mechanical stresses in the microfluidic device 10 during fabrication and use. In addition, the materials of the first substrate 11, the microstructure 13, the precursor material 15, and the second substrate 17 can be selected to be chemically resistant to chemical reagents (i.e., acidic and/or alkaline chemical reagents) that may be used during the operation of the microfluidic device 10.

Within the microfluidic device 10, fluids involved in the experiment/test may come into contact only with surfaces of the microfluidic device 10, which are under complete control. In this regard, the surfaces of the microfluidic device 10 can be modified to be active or passive. For example, the surface can include a catalyst or the surface can be covered with a film (e.g., polysiloxane) to make the surface neutral. In addition, the microfluidic device 10 may include electrical conductors, electrodes, and the like, that may be used a heaters, sensors, and the like.

For the purposes of illustration only, and without limitation, embodiments of the present invention will be described with particular reference to the below-described fabrication methods. Note that not every step in the process is described with reference to the process described in the figures hereinafter. Therefore, the following fabrication processes is not intended to be an exhaustive list that includes every step required to fabricate the embodiments of the microfluidic devices of the present invention.

Figure 2A:
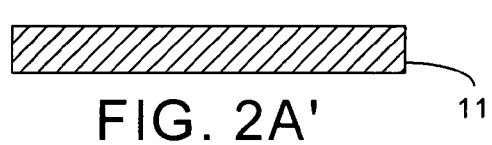
FIGS. 2A' through 2E illustrate cross-sectional views of an exemplary fabrication process of the microfluidic device illustrated in FIG. 1.
Figure 2B:
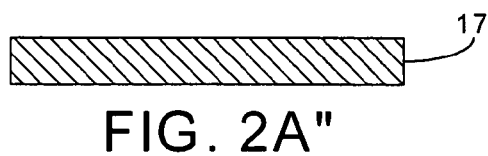
Figure 2B:
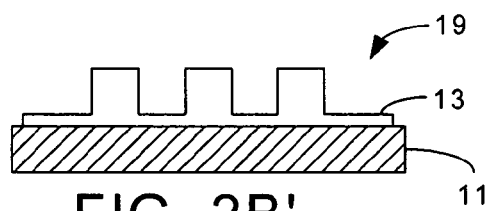

FIGS. 2A' through 2E are cross-sectional views of a representative fabrication of the microfluidic device 10 illustrated in FIG. 1. FIGS. 2A' and 2B' are cross-sectional views of the formation a first assembly 19, while FIGS. 2A" and 2B" are cross-sectional views of the formation of a second assembly 21.

FIGS. 2A' and 2B' illustrate the formation (e.g., vacuum molding) of the microstructure 13 on the first substrate 11 to form the first assembly 19. FIGS. 2A" and 2B" illustrate the formation (e.g., vacuum molding) of the precursor material 15 on the second substrate 17 to form the second assembly 21.

Figure 2C:
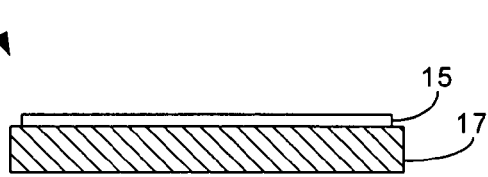
Figure 2C:
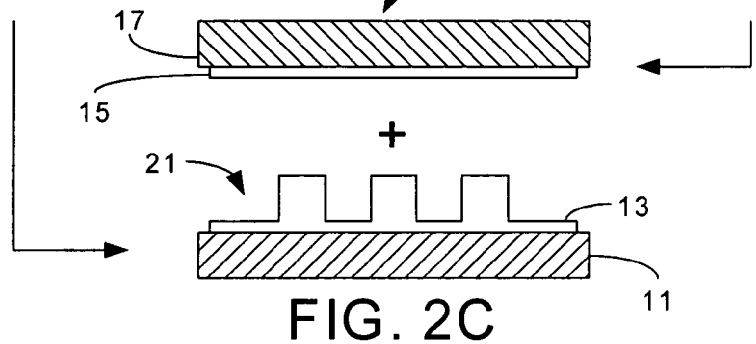

In one embodiment the first assembly 19 and the second assembly 21 can be pre-sintered at about 500° C. for about 5 hours prior to the step shown in FIG. 2C. In particular, the pre-sintering process includes: heating the first assembly 19 and/or the second assembly 21 from about 20° C. to about 500° C. over the course of about 2 hours, holding the temperature of the first assembly 19 and/or the second assembly 21 for about 1 hour, and reducing the temperature from about 500° C. to about 20° C. over a 2 hour time period.

Figure 2D:
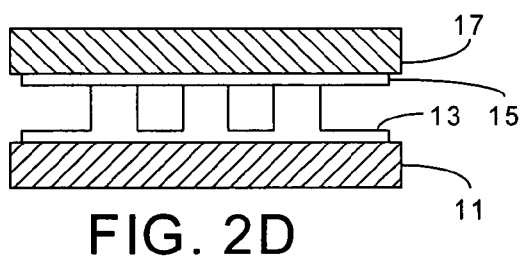
Figure 2E:
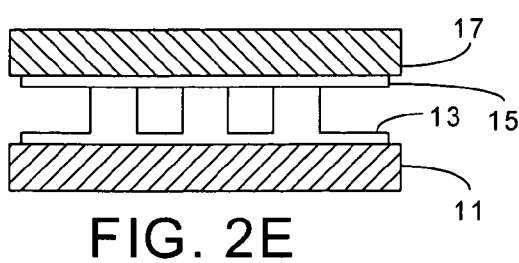

FIGS. 2C and 2D illustrate the combination of the first assembly 19 and the second assembly 21, where the second assembly 21 is disposed on top of the first assembly 19 such that the microstructure 13 is in contact with the precursor material 15. Thereafter, the first assembly 19 and the second assembly 21 are sintered at about 820° C. for about 5 hours to form the microfluidic device 10, as shown in FIG. 2E.

In particular, the sintering process includes: heating the first assembly 19 and/or the second assembly 21 from about 20° C. to about 820° C. over the course of about 2 hours, holding the temperature of the first assembly 19 and/or the second assembly 21 for about 20 minutes, reducing the temperature from about 820° C. to about 500° C. over a 10 minute time period, and reducing the temperature from about 500° C. to about 20° C. over a 2 hour time period.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

Therefore, having thus described the invention, at least the following is claimed:

1. A borosilicate glass, wherein the CTE of the borosilicate glass is in a range from about $30 \times 10^{-7}/°$ C. to $45 \times 10^{-7}/°$ C., wherein the softening point of the borosilicate glass is in a range between about 600 and 1000° C., wherein the borosilicate glass has a percent weight loss of less than 10 milligrams/dm$^2$ according to an acid resistance test, wherein the borosilicate glass has a percent weight loss of less than 250 milligrams/dm$^2$ according to an alkali resistance test, and wherein the borosilicate glass comprises:

$SiO_2$ in the range from about 68% to 73% by total composition weight;

$B_2O_3$ in the range from about 13% to 17% by total composition weight;

$Al_2O_3$ in the range from about 8% to 15% by total composition weight; and lithium oxide ($Li_2O$) in the range from about 2% to 5% by total composition weight;

wherein the borosilicate glass resists devitrification upon sintering without the addition of an inhibitor oxide, and wherein the borosilicate glass further includes one or more alkaline-earth oxides or rare-earth oxides, wherein the sum of the weight percentages of the one or more alkaline-earth oxides or rare-earth oxides is in a range between about 0.1% and 7% by total composition weight.

2. A borosilicate glass, wherein the CTE of the borosilicate glass is in a range from about $30 \times 10^{-7}/°$ C. to $45 \times 10^{-7}/°$ C., wherein the softening point of the borosilicate glass is in a range between about 600 and 1000° C., wherein the borosilicate glass has a percent weight loss of less than 10 milligrams/dm$^2$ according to an acid resistance test, wherein the borosilicate glass has a percent weight loss of less than 250 milligrams/dm$^2$ according to an alkali resistance test, and wherein the borosilicate glass comprises:

$SiO_2$ in the range from about 68% to 73% by total composition weight;

$B_2O_3$ in the range from about 13% to 17% by total composition weight;

$Al_2O_3$ in the range from about 8% to 15% by total composition weight; and lithium oxide ($Li_2O$) in the range from about 2% to 5% by total composition weight;

wherein the borosilicate glass resists devitrification upon sintering without the addition of an inhibitor oxide, and wherein the borosilicate glass further includes substantially none of one or more of potassium oxide ($K_2O$) or sodium oxide ($Na_2O$).

3. The borosilicate glass of claim 1 or 2, wherein the borosilicate glass further includes:

zirconium oxide ($ZrO_2$) in the range between about 0.1% and 5% by total composition weight.

4. The borosilicate glass of claim 1 or 2, wherein the borosilicate glass further includes:

zirconium oxide ($ZrO_2$) in the range between about 1% and 3% by total composition weight.

5. The borosilicate glass of claim 1 or 2, wherein alkaline-earth oxide is selected from at least one of barium oxide (BaO), strontium oxide (SrO), calcium oxide (CaO), and magnesium oxide (MgO), and wherein the rare-earth oxide is selected from at least one of lanthanum oxide ($La_2O_3$), tantalum oxide ($Ta_2O_3$), yttrium oxide ($Y_2O_3$) and cerium oxide ($CeO_2$).

* * * * *